United States Patent
Ghezzi et al.

[11] Patent Number: 5,132,239
[45] Date of Patent: Jul. 21, 1992

[54] PROCESS FOR MANUFACTURING EEPROM MEMORY CELLS HAVING A SINGLE LEVEL OF POLYSILICON AND THIN OXIDE BY USING DIFFERENTIAL OXIDATION

[75] Inventors: Paolo Ghezzi, Rivolta d'Adda; Carlo Riva; Grazia Valentini, both of Monza, all of Italy

[73] Assignee: SGS-Thomson Microelectronics s.r.l., Agrate Brianza, Italy

[21] Appl. No.: 574,677

[22] Filed: Aug. 30, 1990

[30] Foreign Application Priority Data

Sep. 4, 1989 [IT] Italy .................. 21619 A/89

[51] Int. Cl.$^5$ .................. H01L 21/336
[52] U.S. Cl. .................. 437/43; 437/979
[58] Field of Search .................. 437/43, 29, 48, 49, 437/52, 979

[56] References Cited

U.S. PATENT DOCUMENTS 4,019,197  1/1977  Lohstroh et al. .................. 357/23
4,049,477  9/1977  Ligon .................. 148/187

FOREIGN PATENT DOCUMENTS 0051534  5/1982  European Pat. Off.
0268315  5/1988  European Pat. Off.
57-76877  5/1982  Japan .................. 437/43
63-62382  3/1988  Japan .................. 437/43
1-152650  6/1989  Japan .................. 437/43
2-218167  8/1990  Japan .................. 437/43

*Primary Examiner*—Olik Chaudhuri
*Assistant Examiner*—G. Fourson
*Attorney, Agent, or Firm*—Sixbey, Friedman Leedom & Ferguson

[57] ABSTRACT

The process for manufacturing EEPROM memory cells having a single level of polysilicon and thin oxide with selection transistor, sensing transistor having a floating gate, control gate with a capacitive coupling to the floating gate and a tunnel area with thin oxide, comprises a first step involving the definition of active areas free of field oxide, a second step involving an ionic implantation at a coupling area between the control gate and the floating gate, a third step involving the creation of gate oxide at the active areas, a fourth step involving an additional ionic implantation at said coupling area between the control gate and the floating gate and at said tunnel area, a fifth step involving the removal of the gate oxide superimposed over said areas, a sixth step involving the differentiated growth of coupling oxide and tunnel oxide at said coupling areas and tunnel areas and a seventh step involving the deposition of a layer of polysilicon constituting the floating gate.

3 Claims, 3 Drawing Sheets

PROCESS FOR MANUFACTURING EEPROM MEMORY CELLS HAVING A SINGLE LEVEL OF POLYSILICON AND THIN OXIDE BY USING DIFFERENTIAL OXIDATION

The present invention relates to a process for manufacturing EEPROM memory cells having a single level of polysilicon and thin oxide by using differential oxidation.

Cells of this type are known which comprise a floating gate sensing transistor and a selection transistor to select the cell to be programmed in the set of cells of the matrix. The floating gate is capacitively coupled to an N+ diffusion which acts as a control gate. The cell also comprises a thin oxide tunnel area, between the floating gate and the drain of the cell, at which there occurs the passage of electrons in the writing and erasure steps.

During a writing pulse the control gate is held grounded while the drain is connected to high voltage by means of the selection transistor. Electrons flow from the floating gate to the drain and at the end of the pulse the sensing transistor is in "on" state.

During an erasure pulse the drain is grounded and the control gate is at a high voltage. Electrons flow from the drain to the floating gate and at the end of the pulse the sensing transistor is in "off" state.

The writing and erasure efficiency is controlled by the values of the drain coupling coefficients Ad and the gate coupling coefficients Ag, respectively. In particular, if Cd is the sum of the drain capacity and of the sensing transistor capacity, Ctun is the tunnel capacity, Cpp is the control gate capacity, Ctot is the total capacity of the floating gate towards all the nodes, the coefficient Ad is directly proportional to the sum of Cd and Ctun and inversely proportional to Ctot, while the coefficient Ag is directly proportional to Cpp and inversely proportional to Ctot. For a good writing and erasure efficiency coefficient Ag must be high and Ad low.

The use of a technology having a single level of polysilicon in the manufacture of EEPROM memory cells has several advantages over the technology having two levels of polysilicon, both in efficiency and in reliability, connected to a greater process simplicity in devices in which a high memory density is not called for but rather process compatibility. In fact this type of approach does not require the use of technological steps which are critical for the definition of the superimposition of the double polysilicon layer. Better reliability is obtained by the absence of oxide between the two polysilicon layers (interpoly oxide) and by the elimination of high-temperature treatments to which the thin oxide is subjected during the growth of the interpoly oxide.

A known EEPROM cell having a single level of polysilicon used the same thickness of oxide in the tunnel area and in the coupling area between control gate and floating gate. In particular, the manufacturing of such cell provides for the introduction of an MOS condenser with thin oxide for the capacitive coupling between the control gate and the floating gate.

The above cell is incorporated in a standard process with the addition of one mask only necessary for the definition of the thin oxide areas. The mask is inserted after the growth of the gate oxide and opens both tunnel and coupling areas between the floating gate and the control gate. Such masking is followed by implantation of N dopant (phosphorus $10^{14}$–$10^{15}$ at/cm$^3$), by attack of the gate oxide, by tunnel oxidation and by deposition of polysilicon.

With this process architecture, the gate coupling coefficient Ag is substantially determined by the ratio between the coupling thin oxide and drain areas. To obtain a good cell programming efficiency, that is, a sufficiently high value of Ag, it is thus necessary to have a large area of thin oxide coupling (about a factor of 5 with respect to the tunnel area).

This type of approach, with respect to the technology having two levels of polysilicon, involves problems and disadvantages introduced by the large thin oxide area used. The disadvantages can be summarized as: a) higher net area consumption; b) reliability problems due to the defectiveness of the thin oxide; c) presence of two tunnel areas in series, which can be configured like two tunnel diodes in series, and thus create problems of sensitivity to overvoltages.

The defectiveness of the thin oxide turns out to be a very important parameter for assessing the possibility of the use of the technology having a single level of polysilicon. A high level of defectiveness could cancel out the reliability advantages introduced by the elimination of the technological steps related to the double polysilicon. The selection between the two types of technology is substantially dictated by the level of defect density of the thin oxide.

The existence of two tunnel diodes in series, representative of the two thin oxide areas, makes the device sensitive to any overvoltages which could lead to the breakdown of the thin oxide, due to the direct passage of tunnel current between the cell's drain and its control gate.

An improvement in the performance of the cell from the point of view of reliability can be introduced by reducing the thin oxide area.

The object of the present invention is to accomplish a process for manufacturing EEPROM memory cells having a single level of polysilicon and thin oxide, which provides for the growth of an oxide at the coupling area between the control gate and the floating gate having a greater thickness with respect to the thickness of the oxide at the tunnel area.

According to the invention such object is attained with a process for manufacturing EEPROM memory cells having a single level of polysilicon and thin oxide comprising a selection transistor, a sensing transistor having a floating gate, a control gate with a capacitive coupling to said floating gate and a tunnel area with thin oxide, characterized in that it comprises a first step involving the definition of active areas free of field oxide, a second step involving an ionic implantation at a coupling area between the control gate and the floating gate, a third step involving the creation of gate oxide at the active areas, a fourth step involving an additional ionic implantation at said coupling area between control gate and floating gate and at said tunnel area, a fifth step involving the removal of the gate oxide superimposed over said areas, a sixth step involving the differentiated growth of coupling oxide and tunnel oxide at said coupling areas and tunnel areas and a seventh step involving the deposition of a layer of polysilicon constituting the floating gate.

There is thus obtained, by means of a double ionic implantation at the coupling areas between the control gate and the floating gate, a higher growth of oxide in the coupling areas with the consequent improvement of the performance of the cell from the point of view of reliability, since the area of thin oxide in the tunnel area is reduced on a percentage basis. Differentiated oxidation eliminates the tunnel diode on the control gate, reducing the device's sensitivity to overvoltages during both writing and erasure of the cell.

BRIEF DESCRIPTION OF THE DRAWINGS

The features of the present invention shall be made more evident by the following detailed description of an embodiment illustrated as a non-limiting example in the enclosed drawings, wherein.

DETAILED DESCRIPTION OF THE INVENTION

Figure 1:
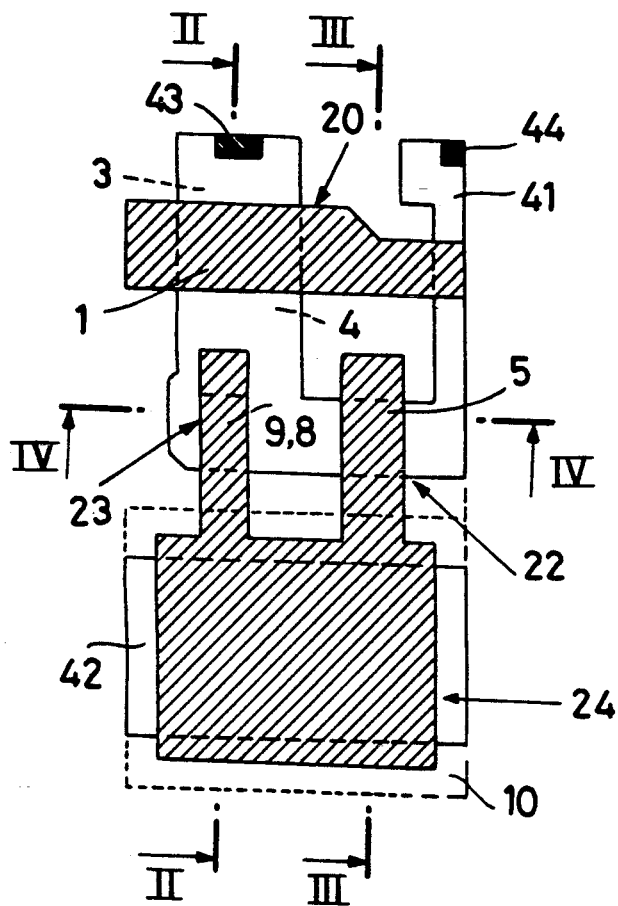
FIG. 1 is a top plan view of an EEPROM cell according to the invention.
Figure 4:
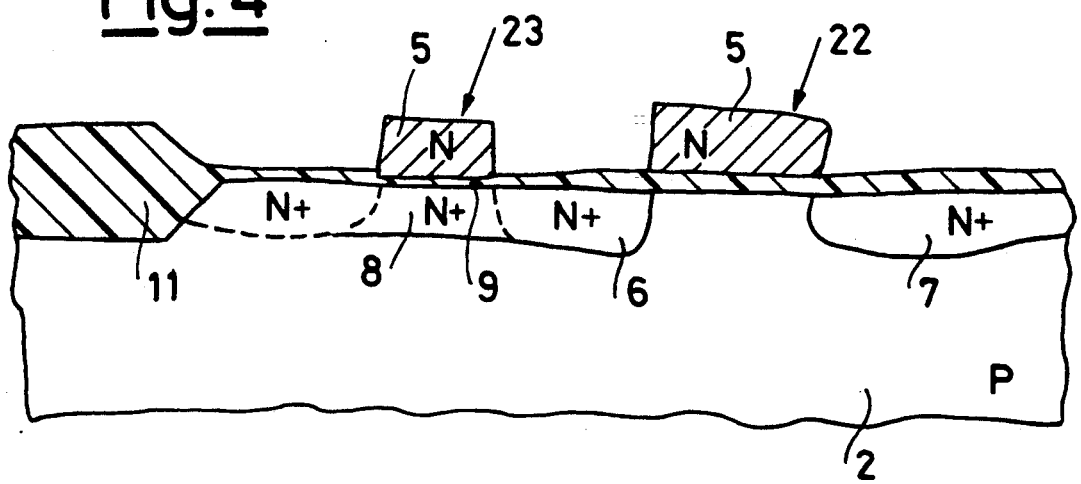
FIG. 4 is a sectional view of the cell taken along the line IV—IV of FIG. 1.
Figure 2:
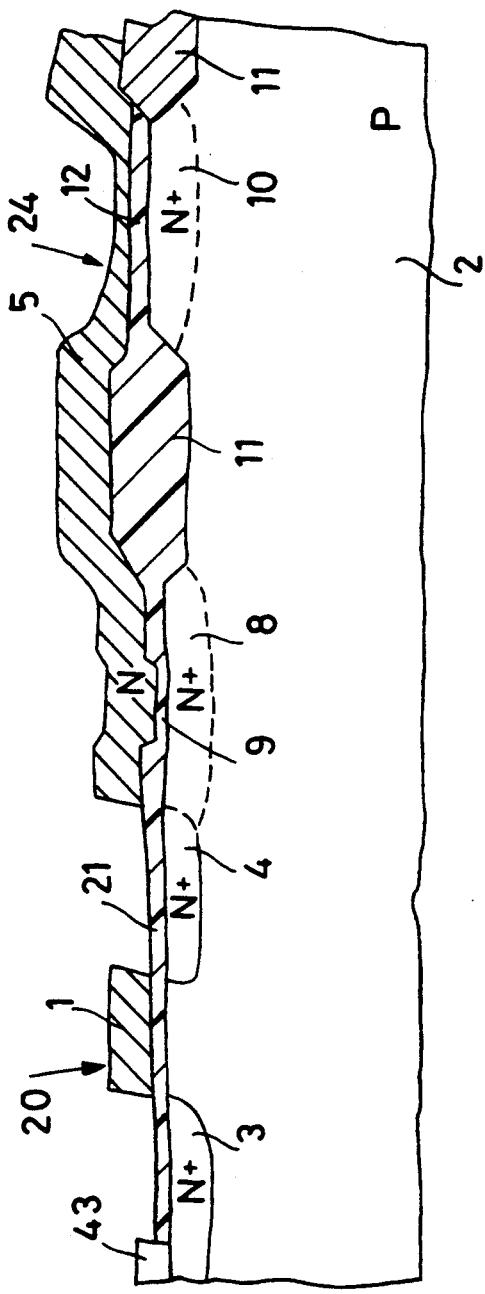
FIG. 2 is a sectional view of the above cell taken along the line II—II of FIG. 1.
Figure 3:
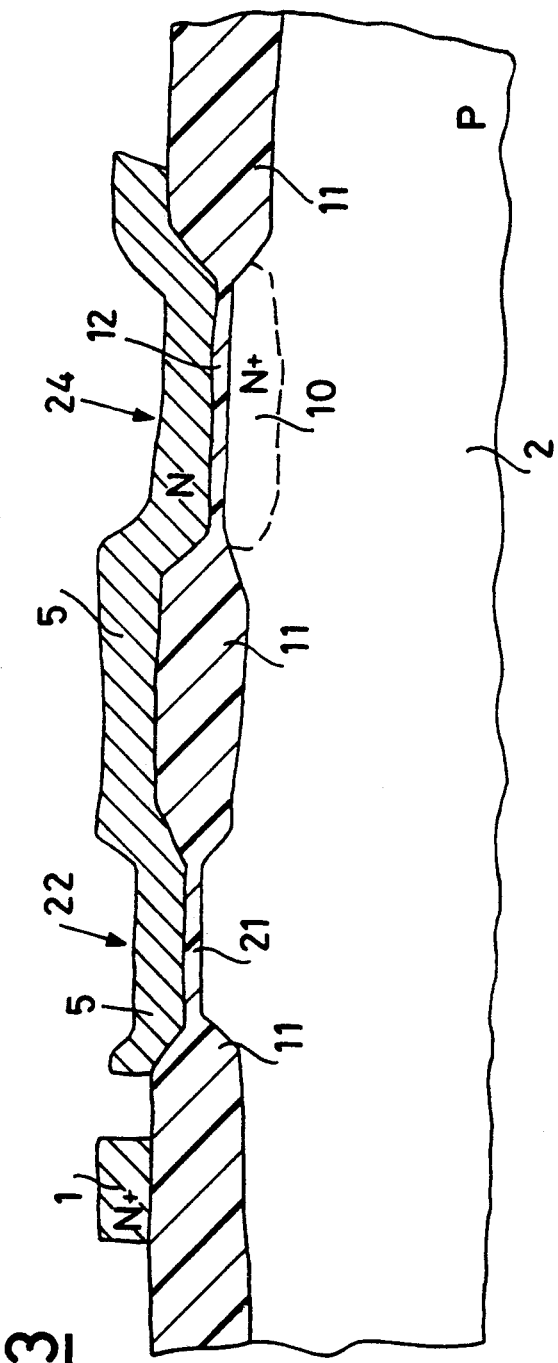
FIG. 3 is a sectional view of the cell taken along the line III—III of FIG. 1.

With reference to FIGS. 1 to 4, wherein the references 41 and 42 represent the active areas free from field oxide 11, (FIGS. 2 to 4) and references 43, 44 indicate the bit-line contact and earth areas, the EEPROM cell comprises a selection transistor 20 whose gate is represented by a layer of polysilicon 1 having an N type doping (constituting the word-line) superimposed through a gate oxide 21 over a P type substrate 2, while the drains and sources are represented by N+ type areas 3, 4 obtained inside the substrate 2 (FIG. 2). The cell also comprises a sensing transistor having a floating gate represented by a layer of polysilicon 5 with an N type doping superimposed over the substrate 2 through oxide gate 21, while the drains and sources are represented by regions 6, 7 of N+ type, obtained inside the substrate 2.

The floating gate 5 is capacitively coupled to an N+ type area 8 obtained in the substrate 2 by means of a thin oxide layer 9 superimposed over the substrate 2. Said area 9 forms a tunnel area 23 for the acceleration of the negative charges.

The floating gate 5 is also capacitively coupled, in an area 24 with oxide 12 having a greater thickness than that of the thin oxide 9, to an area 10 of N+ type, which constitutes the cell's control gate.

Figure 5:
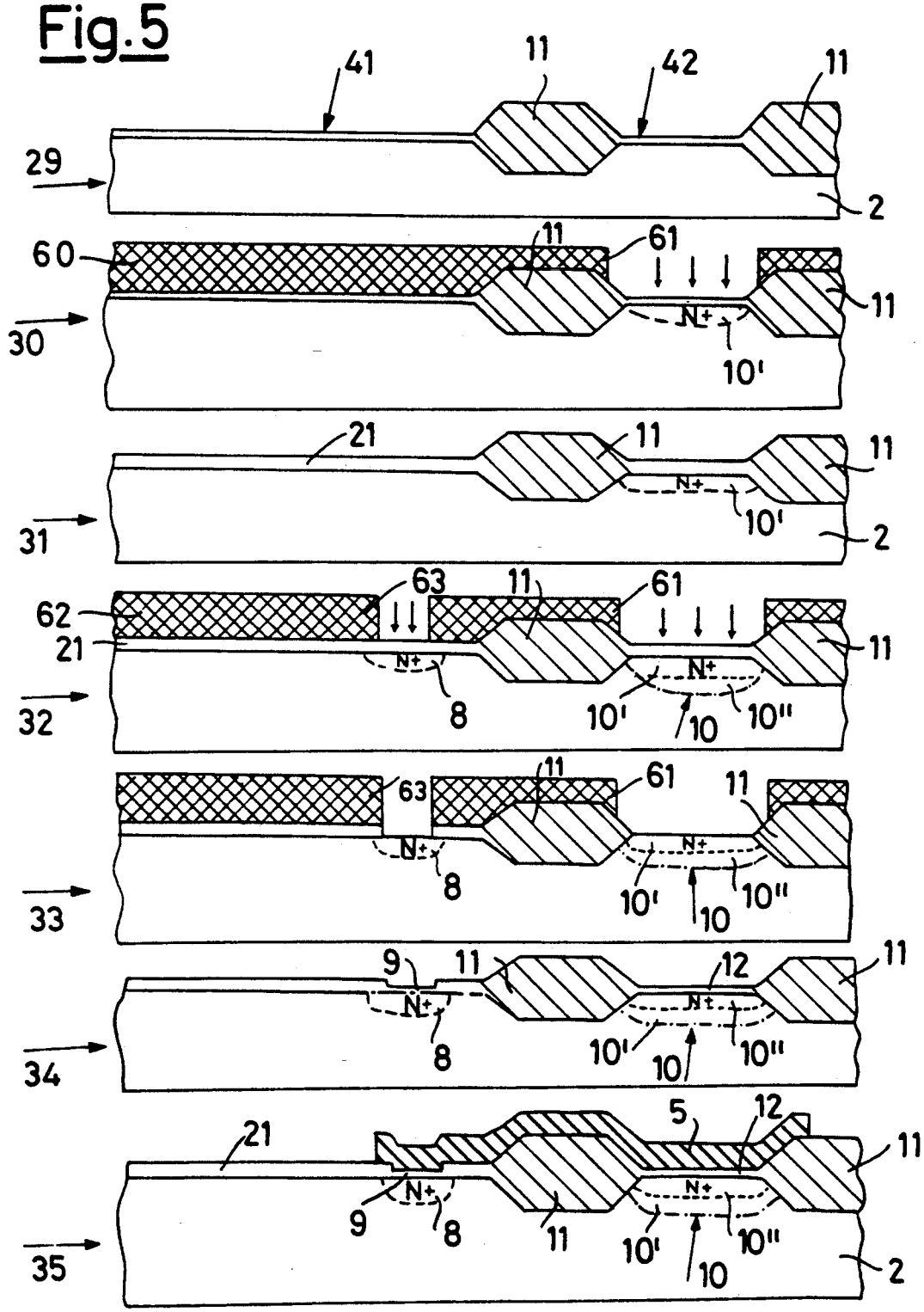
FIG. 5 shows a succession of steps of the process for manufacturing the cell of FIGS. 1 to 4.

With reference to FIG. 5, accomplished according to sections similar to that of FIG. 2, there are indicated the successive steps 29-35 of the process for the creation of coupling areas 9, 12 between floating gate 5 and said N+ dopant areas 8, 10.

A first step 29 provides for the definition of two active areas 41, 42 superimposed over the substrate 2 and separated from one another by field oxide areas 11, accomplished at the tunnel area 23 and at the coupling area 24 between the control gate 10 and the floating gate 5.

A second step 30 provides for the preliminary operation of the surface masking of the cell by means of a mask 60 having a window 61 accomplished at the coupling area 24 between the control gate 10 and the floating gate 5, followed by an ionic implantation 10' executed through said window 61.

A third step 31 provides for the creation of gate oxide 21 at the active areas 41, 42.

A fourth step provides for the preliminary operation of the surface masking of the cell by means of a mask 62 having a pair of windows 63, 61 accomplished at the coupling area 24 between the control gate 10 and the floating gate 5 and of the tunnel area 23, followed by an ionic implantation 10'', 8.

A fifth step 33 provides for the removal of the gate oxide 21 at the active areas 41, 42.

A sixth step 34 provides for a differentiated growth of coupling oxide 12 and tunnel oxide 9 on the active areas 41, 42 at said coupling areas 24 and tunnel areas 23, this deriving from the different doping of the two areas.

A seventh step 35 provides for the deposition of a layer of polysilicon 5 constituting the floating gate.

We claim:

1. A process for manufacturing EEPROM memory cells on a substrate, and having a single layer of polysilicon and thin oxide comprising a selection transistor, a sensing transistor having a floating gate, a control gate with a capacitive coupling to said floating gate and a tunnel area with thin oxide, said process comprising the steps of:
   a. forming active areas, free of field oxide, in said cell;
   b. performing a first ionic implantation at a coupling area between the control gate and the floating gate;
   c. creating a gate oxide at said active areas;
   d. performing a second ionic implantation at said coupling area and at said tunnel area;
   e. removing the gate oxide superimposed over said coupling area and said tunnel area;
   f. doping said coupling area and doping said tunnel area differently with respect to said coupling area, then growing coupling oxide and tunnel oxide at said coupling area and tunnel area respectively; and
   g. depositing a layer of polysilicon on the cell to constitute said floating gate.

2. The process of claim 1 wherein said substrate is of the P type and the coupling area is made N+ type in said first ionic implantation.

3. The process of claim 1 wherein said substrate is of the P type and the coupling area is made N+ type in said second ionic implantation.

* * * * *